(12) United States Patent
Lollio

(10) Patent No.: US 9,647,559 B2
(45) Date of Patent: May 9, 2017

(54) CIRCUIT IMPLEMENTATIONS REDUCING LOSSES IN A POWER SUPPLY

(71) Applicant: International Rectifier Corporation, El Segundo, CA (US)

(72) Inventor: Alex Lollio, Pavia (IT)

(73) Assignee: Infineon Technologies Americas Corp., El Segundo, CA (US)

( * ) Notice: Subject to any disclaimer, the term of this patent is extended or adjusted under 35 U.S.C. 154(b) by 26 days.

(21) Appl. No.: 14/605,141

(22) Filed: Jan. 26, 2015

(65) Prior Publication Data

US 2016/0218611 A1 Jul. 28, 2016

(51) Int. Cl.
| | |
|---|---|
| *H02M 3/156* | (2006.01) |
| *H02M 3/158* | (2006.01) |
| *H02M 3/157* | (2006.01) |
| *H03K 17/082* | (2006.01) |
| *H02M 1/00* | (2006.01) |

(52) U.S. Cl.
CPC ...... *H02M 3/1588* (2013.01); *H03K 17/0822* (2013.01); *H02M 2001/0029* (2013.01); *Y02B 70/1466* (2013.01)

(58) Field of Classification Search
CPC ..... H02M 3/156; H02M 3/1588; H02M 3/157
USPC .......................... 323/271, 282, 283, 284, 288
See application file for complete search history.

(56) References Cited

U.S. PATENT DOCUMENTS

| | | | | |
|---|---|---|---|---|
| 4,789,796 A | * | 12/1988 | Foss ....................... | H03K 4/023 326/121 |
| 7,924,063 B2 | * | 4/2011 | Itabashi ............... | H03K 17/063 327/108 |
| 8,933,679 B2 | * | 1/2015 | Zhak ......................... | G05F 3/08 323/222 |
| 9,270,177 B1 | * | 2/2016 | Nakamura ............ | H02M 3/158 |
| 9,318,956 B1 | * | 4/2016 | Nakamura ............ | H02M 3/158 |
| 2010/0066332 A1 | * | 3/2010 | Gray ..................... | H02M 3/156 323/282 |
| 2011/0298438 A1 | * | 12/2011 | Shi .......................... | H02M 1/08 323/282 |
| 2012/0062281 A1 | * | 3/2012 | Briere ................. | H02M 3/1588 327/109 |
| 2014/0217959 A1 | * | 8/2014 | Chen ..................... | H02J 7/0052 320/107 |
| 2016/0149490 A1 | * | 5/2016 | Nakamura ............ | H02M 3/158 323/271 |

* cited by examiner

*Primary Examiner* — Timothy J Dole
*Assistant Examiner* — Sisay G Tiku
(74) *Attorney, Agent, or Firm* — Chapin IP Law, LLC

(57) ABSTRACT

A power supply circuit includes a control switch, a synchronous switch, an inductor, and a voltage ramping circuit. A common node in the power supply serially connects the control switch to the synchronous switch. The common node is further coupled to the inductor that supplies current to a load based on switching the control switch and the synchronous switch to respective ON/OFF and OFF/ON states. The voltage ramping circuit generates and controls ramping of a gate voltage of the control switch based at least in part on a magnitude of a feedback voltage received on a circuit path from the common node. The multi-stage ramping of a switch control voltage reduces one or more of the following: i) QRR losses, ii) switching losses, and/or iii) a dead time of the power supply.

23 Claims, 10 Drawing Sheets

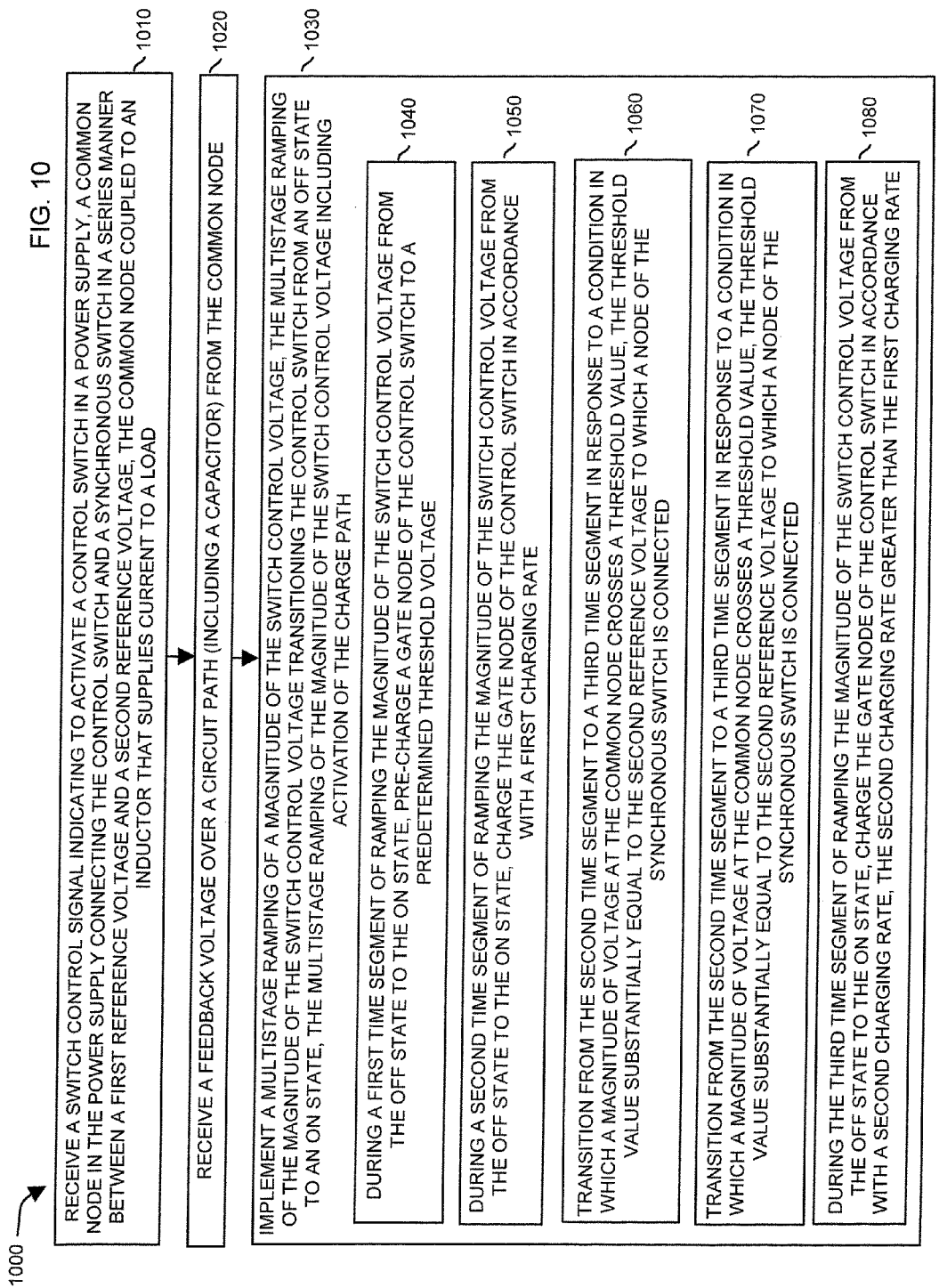

CIRCUIT IMPLEMENTATIONS REDUCING LOSSES IN A POWER SUPPLY

BACKGROUND

Conventional circuits have been used to control a rate of ramping a control voltage applied to a gate node of a control switch (sometimes referred to as a high side switch) in a synchronous buck converter. FIG. 1 is an example diagram of a voltage ramping circuit to ramp a switch control voltage according to the prior art.

In general, as shown in FIG. 1, the conventional voltage ramping circuit 185 in power supply circuit 170 includes a slow charging path and a fast charging path to charge a respective gate node 198 of control switch 171. As known in the art of power supplies, the control switch 171 is activated subsequent to deactivating the synchronous switch 172. More specifically, following deactivation of synchronous switch 171, the voltage ramping circuit 185 activates switch 190 to activate a slow charging path through a combination of capacitor 180 and resistor 175.

When activated, the slow charging path charges the gate node 198 of control switch 171. After a predetermined amount of time of activating the slow path and at least partially charging the voltage of gate node 198, the delay circuit 199 additionally activates switch 192 to charge the gate node 198 of control switch 171 at a faster charging rate (using the fast path).

Thus, according to the conventional ramping circuit 185, during a first portion of time when only the slow path through resistor 175 charges the gate node 198 via activation of switch 190, the voltage at gate node 198 of control switch 110 charges according to a first rate dictated by a combination of the capacitor 180 and the resistor 175. During a second time segment, subsequent to activation of switch 190, the delay circuit 199 activates switch 192, producing a faster path for charging the gate node 198. The fast path bypasses the slow path including the resistor 175, effectively coupling the voltage from capacitor 180 directly to the gate node of control switch 171, more quickly increasing the voltage applied to the gate node 198.

BRIEF DESCRIPTION OF EMBODIMENTS

In contrast to conventional techniques, embodiments herein include multi-stage ramping of a switch control voltage to reduce one or more of the following: i) a QRR loss of the switching power supply, ii) switching losses in the switching power supply, and/or iii) a dead time between deactivation of a synchronous switch and activation of the control switch.

For example, in accordance with one embodiment, a power supply circuit includes a control switch, a synchronous switch, an inductor, and a drive control circuit (voltage ramping circuit). A common node (in the power supply such as a switch SW node) serially connects the control switch to the synchronous switch between a first reference voltage and a second reference voltage. The common node is further coupled to the inductor that supplies current to a load based on alternating switching of the control switch and the synchronous switch to ON/OFF and OFF/ON states. The drive control circuit (a voltage ramping circuit) controls a state of the control switch. In one embodiment, during operation, the drive control circuit generates and controls ramping of a switch control voltage (to control activation of the control) based at least in part on a magnitude of a feedback voltage received on a circuit path from the common node.

In accordance with more specific embodiments, the drive control circuit (such as a voltage ramping circuit) implements a novel multistage ramping of a magnitude of the switch control voltage to activate the control switch. For example, during a first time segment of ramping the magnitude of the switch control voltage to transition the control switch from the OFF state to the ON state, to reduce dead time, a first circuit path of the drive control circuit precharges a gate node of the control switch to a predetermined threshold voltage; during a second time segment of ramping the magnitude of the switch control voltage to transition the control switch from the OFF state to the ON state, to reduce QRR losses, a second circuit path of the drive control circuit charges the gate node of the control switch in accordance with a first charging rate (such as a slow charging rate through a resistor); and during a third time segment of ramping the magnitude of the switch control voltage to transition the control switch from the OFF state to the ON state, to reduce switching losses, a third circuit path of the drive control circuit charges the gate node of the control switch in accordance with a second charging rate (faster charging rate than the slow charging rate through a resistor).

In yet further embodiments, the first circuit path, the second circuit path, and the third circuit path of the driver control circuitry are connected in parallel. The feedback path from the common node (SW node) includes a capacitor configured to convey the feedback voltage from the common node to the parallel circuit paths.

Initially, deactivation of the synchronous switch and receipt of a control signal indicating to activate the control switch causes the first circuit path to quickly pre-charge the node of the control switch to a predetermined voltage. The fast charging of the gate of the control switch reduces excess dead time (i.e., the time between deactivation of synchronous switch and activation of the control switch).

In one embodiment, in addition to pre-charging the gate node of the control switch using the first circuit path, the second circuit path also charges the gate node of the control switch, albeit at a slower charging rate. Subsequent to pre-charging the gate node of the control switch to a threshold value, the first circuit path discontinues pre-charging the gate node of the control switch. However, during a second time segment, the second circuit path (such as slow charging path through a resistor) continues to charge the gate node of the control switch.

Eventually, ramping of the voltage magnitude of the gate node of the control switch during the second time segment causes the voltage magnitude to increase to a second threshold value. In one non-limiting example embodiment, ramping of the voltage of the gate node of the control switch to the second threshold value causes activation of the third circuit path (fast charging path). The third circuit path charges the gate of the control switch during the third time segment. In general, the charge boost of from the third circuit path during the third time segment increases a rate of ramping a magnitude of the switch control voltage of the gate node to transition the control switch to the ON state.

In one embodiment, and as further discussed herein, activation of the first circuit path during the first time segment reduces a dead time of the switching power supply. Activation of the second circuit path during the second segment reduces QRR (reverse recovery charge) losses in the switching power supply. Activation of the third circuit path during the third time segment reduces switching losses in the power supply.

As discussed herein, techniques herein are well suited for use in switching power supply circuitry such as synchronous DC-DC buck converters. However, it should be noted that embodiments herein are not limited to use in such applications and that the techniques discussed herein are well suited for other applications as well.

These and other more specific embodiments are disclosed in more detail below.

Note that further embodiments herein can include analog and/or digital circuitry (e.g., one or more processor devices) to carry out and/or support any or all of the hardware or method operations disclosed herein. In other words, in one embodiment, one or more computerized devices or processors can be programmed and/or configured to operate as explained herein to carry out different embodiments of the invention.

Yet other embodiments herein include software programs to perform the steps and operations summarized above and disclosed in detail below. One such embodiment comprises a computer program product including a non-transitory computer-readable storage medium (i.e., any physical computer readable hardware storage medium) on which software instructions are encoded for subsequent execution. The instructions, when executed in a computerized device (e.g., computer processing hardware) having a processor, program and/or cause the processor to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to a method, system, computer program product, etc., that supports operations as discussed herein.

One or more embodiments herein include a computer readable storage medium and/or system having instructions stored thereon. In accordance with one embodiment, the instructions, when executed by computer processor hardware, cause the computer processor hardware (such as voltage ramping circuit) to: receive a switch control signal indicating to activate a control switch in a power supply, a common node in the power supply connecting the control switch and a synchronous switch in a series manner between a first reference voltage and a second reference voltage, the common node coupled to an inductor that supplies current to a load; receive a feedback voltage over a circuit path from the common node; and based on a magnitude of the feedback voltage, activate a charge path to produce a switch control voltage that controls activation of the control switch.

The ordering of the operations above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor, or within an operating system or a within a software application.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description and Further Summary of Embodiments section below and corresponding figures.

BRIEF DESCRIPTION OF THE DRAWINGS

FIG. 10 is an example diagram illustrating a method according to embodiments herein.

Figure 1:
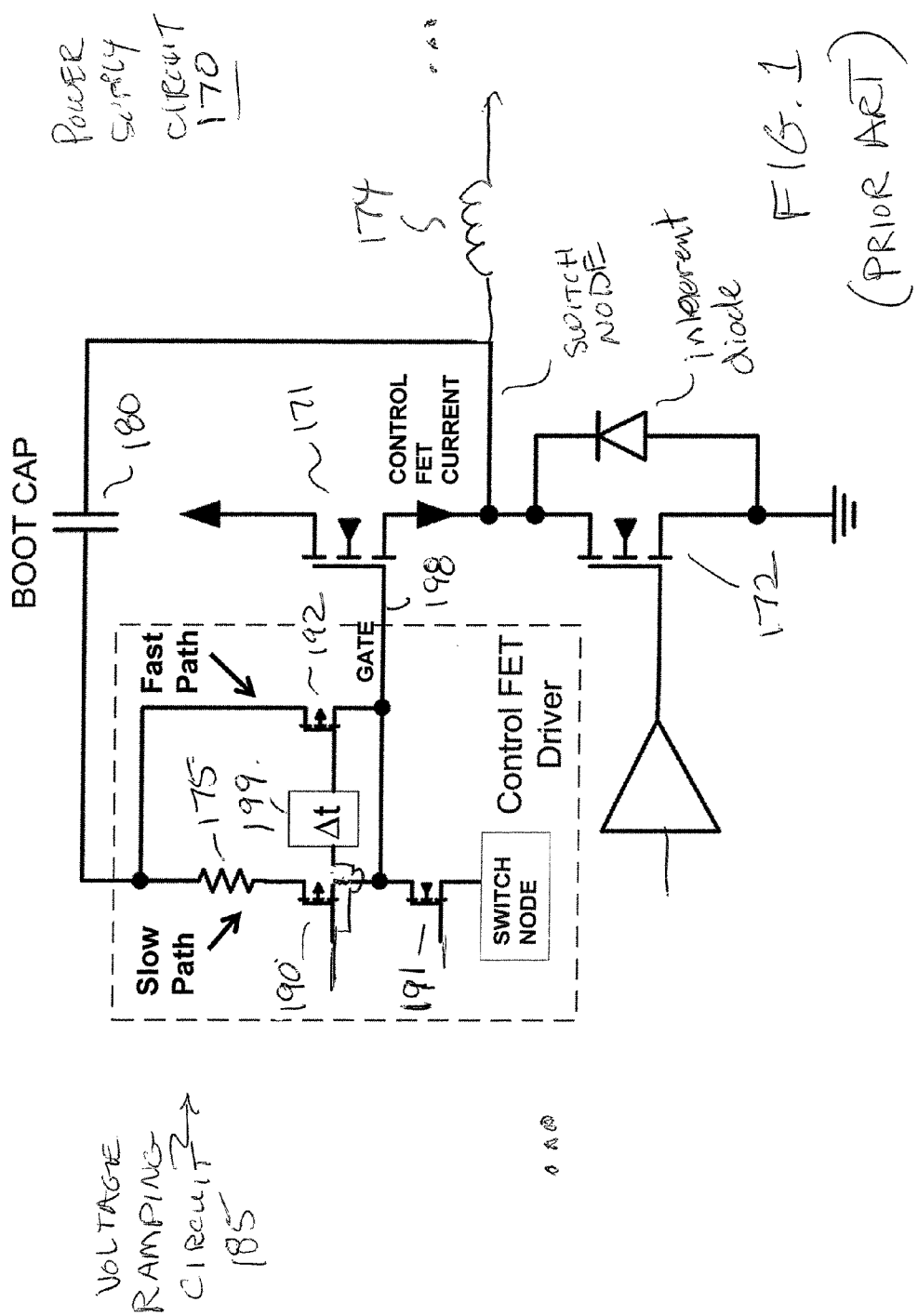
FIG. 1 is an example diagram illustrating a voltage ramping circuit according to the conventional techniques.
Figure 2:
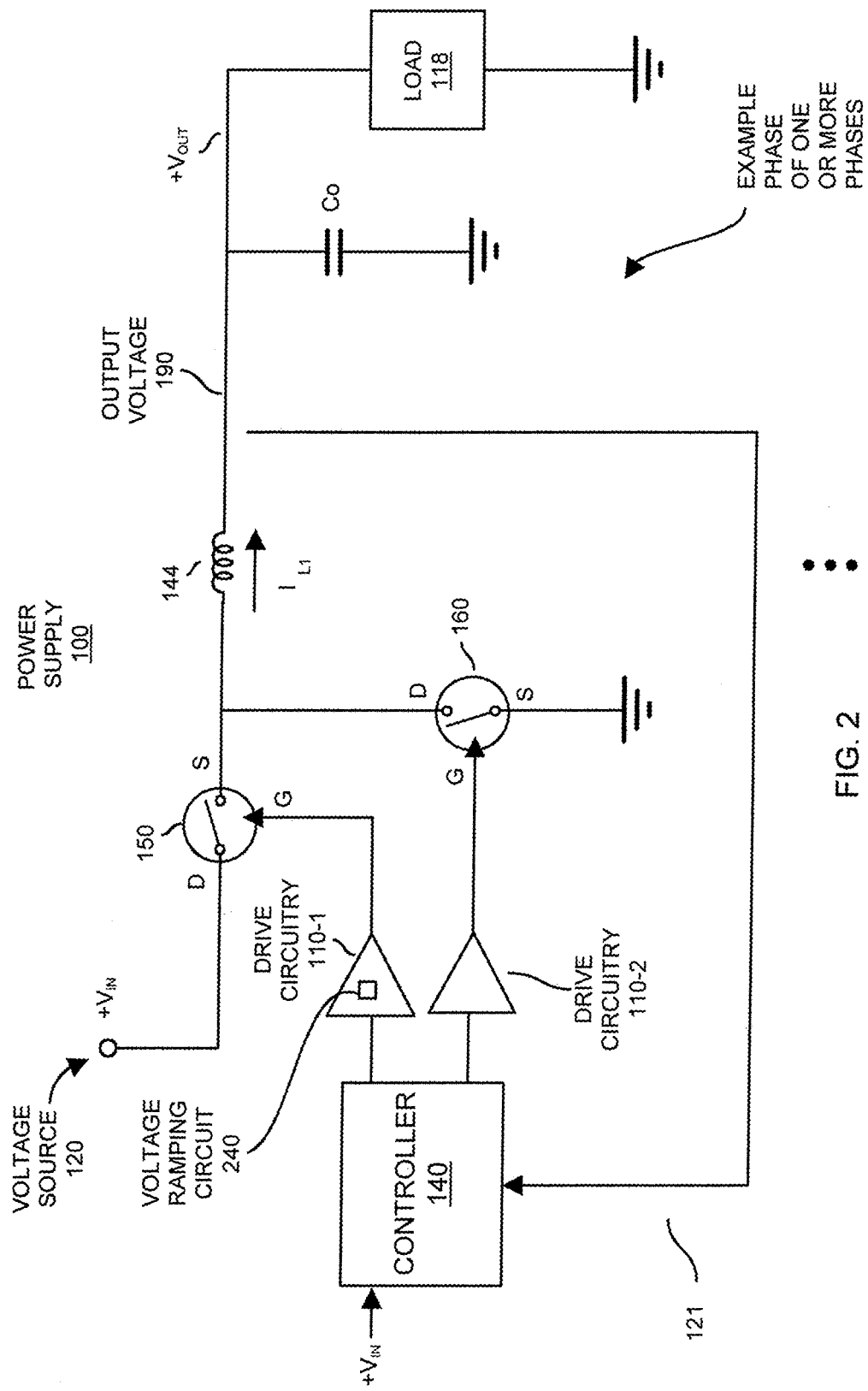
FIG. 2 is an example diagram illustrating a power supply circuit and improved voltage ramping circuit according to embodiments herein.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION AND FURTHER SUMMARY OF EMBODIMENTS

As previously discussed, embodiments herein include a unique voltage ramping circuit to reduce QRR losses, switching losses, and/or a dead time in a switching power supply. For example, a power supply includes a control switch, a synchronous switch, an inductor, and a drive control circuit (voltage ramping circuit). A common node in the power supply serially connects the control switch to the synchronous switch. The common node is further coupled to the inductor. The inductor supplies current to a load based on switching of the control switch and the synchronous switch to respective ON/OFF and OFF/ON states. In one embodiment, the drive control circuit generates and controls ramping of a gate voltage of the control switch for one or more stages of ramping based at least in part on a magnitude of a feedback voltage received on a circuit path from the common node.

Now, more specifically, FIG. 1 is an example diagram of a power supply 100 according to embodiments herein. As shown, the power supply 100 includes controller 140. Controller 140 controls an operation of drivers 110-1 and 110-2 to produce an output voltage 190 within a desired range.

In this example embodiment, controller 140 receives one or more inputs 121 such as Vin, $I_{L1}$, Vout, etc.

Based on the received inputs 121 and configuration settings of controller 140, controller 140 outputs control signals to control the control switch 150 (e.g., high side switch) and synchronous switch 160 (e.g., low side switch) to ON/OFF and OFF/ON states. For example, during an ON/OFF state, the controller 140 activates the control switch to an ON state and deactivates the synchronous switch to an OFF state. Conversely, during an OFF/ON state, the controller 140 deactivates the control switch to an OFF state and activates the synchronous switch to an ON state.

As a more specific illustrative example, during operation, the controller 140 generates signals controlling the driver circuitry 110-1 and 110-2. Based on one or more control signals received from the controller 140, driver circuitry 110-1 controls a state of the control switch 150 (such as a first field effect transistor). Based on one or more control signals received from the controller 140, the driver circuitry 110-2 controls a state of the synchronous switch 160 (such as a second field effect transistor) in power supply 100.

Via switching of the control switch 150 and the synchronous switch 160, the controller 140 produces output voltage 190 to power load 118.

As further shown, the drive circuitry 110-1 (controlling control switch 150) includes voltage ramping circuit 240. As its name suggests, the voltage ramping circuit 240 controls ramping of a magnitude of the voltage applied to the gate node of switch 150. Additional details of the voltage ramping circuit 240 are discussed below in the following FIGS.

In general, when control switch 150 is turned ON (i.e., activated) via respective one or more control signals generated by controller 140 (while the synchronous switch 160 is OFF), the current through inductor resource 144 increases based on a highly conductive path provided by control switch 150 between voltage source 120 (such as a 12 VDC source) and inductor resource 144.

When synchronous switch 160 is turned ON (i.e., activated) via control signals generated by controller 140 (while the control switch 150 is OFF), the current through inductor resource 144 decreases based on a highly conductive path provided by the synchronous switch 160 between the inductor resource 144 and ground as shown.

Based on switching of the control switch 150 and the synchronous switch 160, the controller 140 regulates the output voltage 190 within a desired range to power load 118.

Note that power supply 100 can include multiple phases. Each of the multiple phases can be similar to the example phase shown in FIG. 1. In such an embodiment, the controller 100 operates a combination of the phases to maintain the output voltage 190 within a desired range to power load 118. The phases can be operated in phase or out of phase with respect to each other.

Each phase can include a respective high side switch circuit and low side switch circuit as previously discussed. To deactivate a respective phase, the phase controller 140 can set both high side switch circuitry and low side switch circuitry of the respective phase to an OFF state. When off or deactivated, the respective phase does not contribute to producing current to power the load 118.

In certain instances, the controller 140 or other suitable resource can select how many phases to activate depending on an amount of current consumed by the load 118. For example, when the load 118 consumes a relatively large amount of current, the controller 100 can activate multiple phases to power the load 118. When the load 118 consumes a relatively small amount of current, the controller 140 can activate a single phase to power the load 118.

Figure 3:
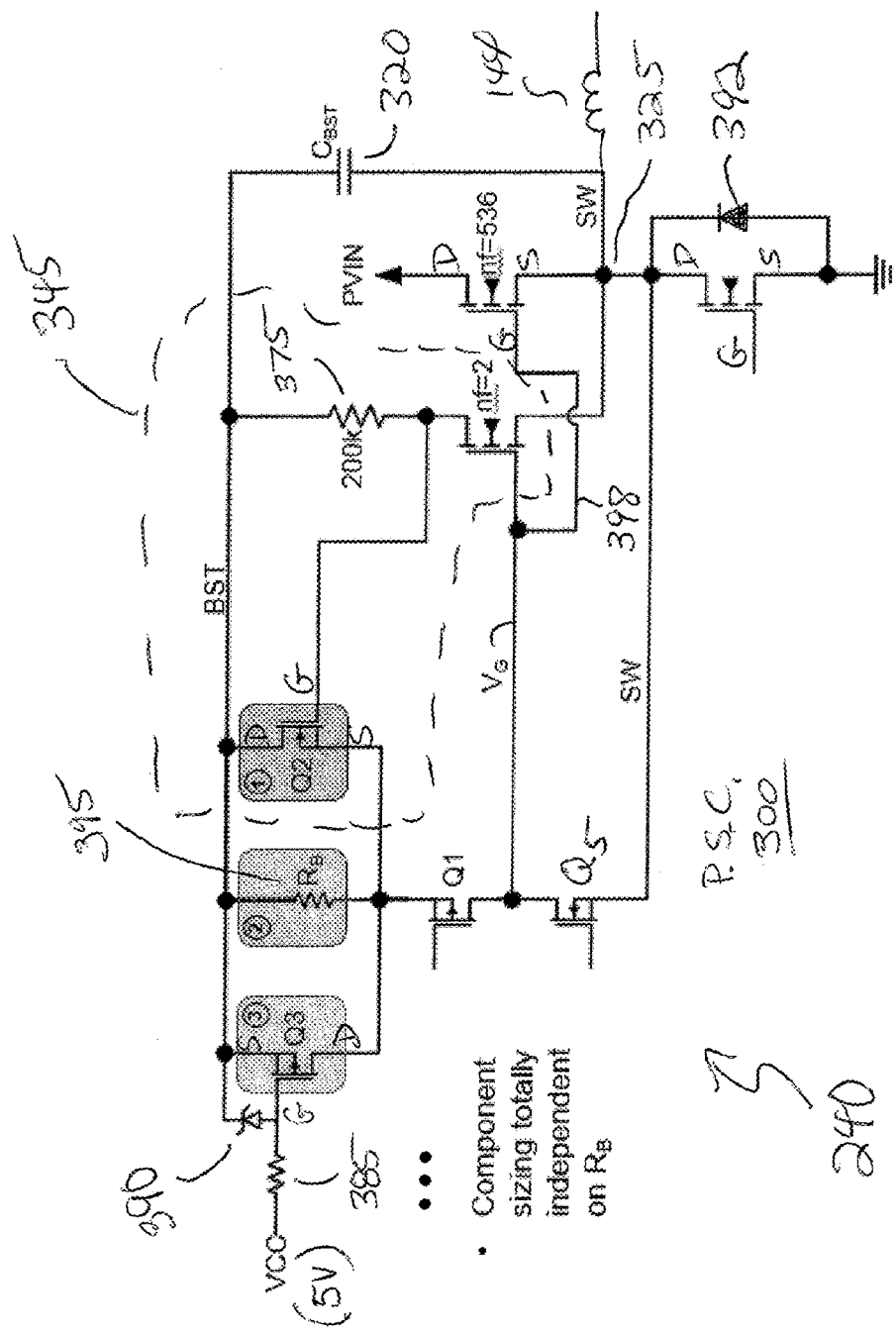
FIG. 3 is an example diagram illustrating details of a voltage ramping circuit according to embodiments herein.

FIG. 3 is an example diagram illustrating details of a voltage ramping circuit according to embodiments herein.

As previously discussed, power supply 100 includes control switch 150 (high side switch circuitry), synchronous switch 160 (low side switch circuitry), inductor 144, and voltage ramping circuit 240 (drive control circuit). As further shown in FIG. 3, common node 325 (labeled SW node) of power supply circuit 300 serially connects the source node of the control switch 150 to the drain node of the synchronous switch 160 between a first reference voltage (PVIN such as 12 VDC when control switch 150 is ON) and a second reference voltage (such as ground when synchronous switch 160 is ON). Synchronous switch 160 includes inherent diode 392 (for reverse recovery) between its respective source node and drain node.

As further shown, the common node 325 is further coupled to the inductor 144 that supplies current to a load 118 based on alternate switching of the control switch 150 and the synchronous switch 160 to ON/OFF and OFF/ON states.

As previously discussed, the control switch 150 and synchronous switch 160 are never activated at the same time. For example, there is at least some delay between a time of deactivating the synchronous switch 160 to an OFF state and a time of activating the control switch 150 to an ON state. Similarly, there is at least some delay between a time of deactivating the control switch 150 to an OFF state and a time of activating the synchronous switch 160 to an ON state.

As further discussed below, the voltage ramping circuit 240 provides novel control of the control switch 150 when transitioning the control switch 150 from an OFF state to an ON state. For example, during operation, the voltage ramping circuit 240 generates and controls ramping of switch control voltage, Vg (switch control voltage), applied to the gate node 398 of control switch 150, based at least in part on a magnitude of a feedback voltage (such as a voltage of node 325) received over a circuit path (including capacitor 320) from the common node 325.

As further shown, the voltage ramping circuit 240 includes three different circuit paths (such as a first charge path, a second charge path, and a third charge path) to charge the gate node 398 of the control switch 150.

The first charge path (such as pre-charge circuit 345) includes switch Q2, resistor 375, and switch Q6. Switch Q6 is fabricated from multiple field effect transistors (nf=2) in parallel. The control switch 150 is fabricated from multiple transistors (nf=536) in parallel. In one embodiment, switch Q2 is a charge control switch device because a state of switch Q2 controls whether a corresponding charge path (from the capacitor 320 to switch Q1) is activated or not.

As its name suggests, and as will be discussed in more detail later in the specification, brief activation of switch Q6 of the pre-charge circuit 345 during a first time segment pre-charges the gate node 398 of the control switch 150 during an initial transition of the control switch 150 from an OFF state to an ON state. In one embodiment, switch Q6 is activated for a short time following activation of switch Q1 to an ON state. Activation of switch Q1 triggers ramping of the voltage Vg.

The second charge path includes resistor 395 that provides continuous flow of current from capacitor 320 through switch Q1 when switch Q1 is turned ON. In general, the resistor 395 limits the amount of current conveyed from the capacitor 320 in the feedback path through switch Q1 to the gate node 398. Thus, when resistor 395 is chosen as a sufficiently high value such as 10 kilo ohms, the second charge path including resistor 395 provides a slow ramping of voltage, Vg.

The third charge path includes a combination of switch Q3, zener diode 390, and resistor 385. In one embodiment, switch Q3 is a charge control switch device because a state of switch Q3 controls whether a corresponding charge path is activated or not.

In general, switch Q3 is activated when a voltage of the switch node 325 increases above a threshold value. As further discussed below, in comparison to the rate of ramping the voltage Vg using the second charge path including resistor 395, activation of switch Q3 increases a rate of ramping the voltage Vg applied to the gate node 398.

Thus, in accordance with embodiments herein, the voltage ramping circuit 240 includes a first circuit path (switch Q2), a second circuit path (resistor 395), and a third circuit path (switch Q3), all of which are connected in parallel with each other as shown in FIG. 3. The feedback path of the voltage from node 325 includes capacitor 320 configured to convey and feedback and AC portion of voltage from the common node 325 to the parallel circuit paths. As further discussed below, deactivation of the synchronous switch 160 and activation of the switch Q1 (a control switch) results in a multi-segment ramping of the voltage, Vg, applied to the gate node 398 of the control switch 150.

Figure 4:
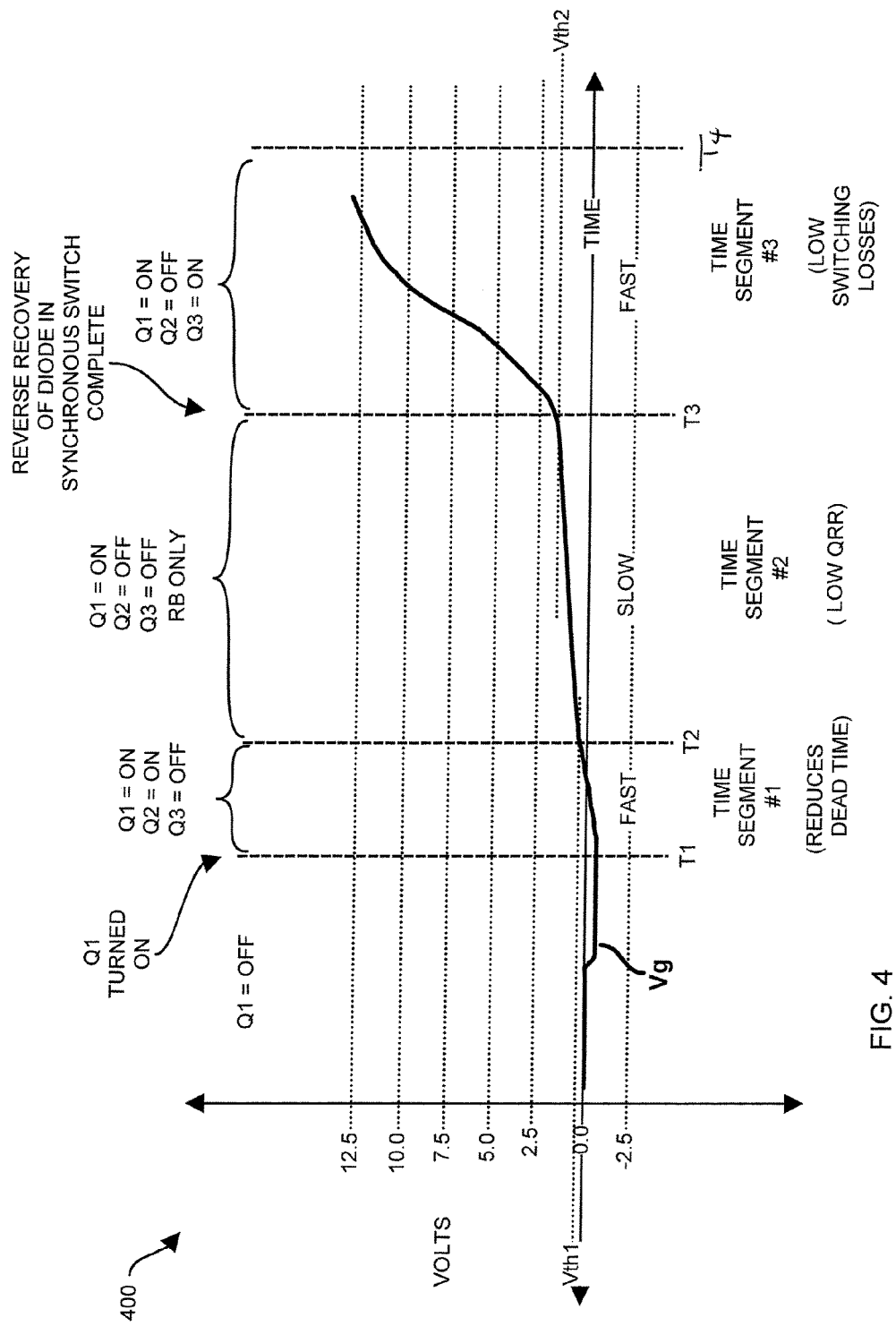
FIG. 4 is an example timing diagram illustrating ramping of a switch control voltage according to embodiments herein.

FIG. 4 is an example timing diagram illustrating ramping of a switch control voltage (such as Vg) according to embodiments herein.

As previously discussed, the voltage ramping circuit 240 (a.k.a., drive control circuit) implements a multistage ramping of a magnitude of the switch control voltage, Vg, applied to gate node 398 to activate the control switch 150. Ramping the magnitude of the switch control voltage (Vg applied to gate node 398) as described herein reduces one or more different types of power losses in the respective power supply circuit 300.

More specifically, as shown in the timing diagram 400 in FIG. 4, during a first time segment #1 of ramping the magnitude of the switch control voltage, Vg, to transition the control switch 150 from the OFF state to the ON state, in order to reduce dead time, the first circuit path of the voltage ramping circuit 240 pre-charges the gate node 398 of the control switch 150 to a predetermined threshold voltage. More specifically, prior to time T1, switch Q1 is turned OFF while switch Q5 associated with control switch 150 is turned ON. This causes the control switch 150 to be set to an OFF state. At time T1, subsequent to turning synchronous switch 160 OFF, the controller 140 controls switch Q1 to an ON state.

The initial transition of the switch Q1 to the ON state results in activation of switch Q2 (ON) during time segment #1 between time T1 and time T2. Switch Q3 is in an OFF state between time T1 and T2. Because the activated switch Q2 (which is in an ON state) provides a low impedance path between the capacitor 320 and switch Q1 (also in an ON state), the switch Q2 acts as a low impedance bypass path with respect to resistor 395, providing fast pre-charging of the gate node 398 during time segment #1.

As further shown in the timing diagram 400, eventually the voltage Vg of the gate node 398 is charged to a threshold voltage Vth1 such as approximately 0+/− volts (such as a value around the ground reference voltage to which the source node of the synchronous switch 160 is connected). At such time T2, when the voltage Vg reaches a threshold value Vth1, switch Q2 is deactivated to an OFF state again.

Subsequent to the activation of switch Q2, during time segment #2 between time T2 and time T3, the conductive path extending from node 325 through a series combination of the capacitor 320, resistor 395, and switch Q1 (ON) continues to charge the gate node 398 of the control switch 150, further ramping the voltage, Vg, to activate the control switch 150 to an ON state. Switch Q3 is in an OFF state between time T2 and T3. Switch Q2 is also in an OFF state between time T2 and T3.

Further ramping of the voltage Vg (charging of the gate node 398) at a slow charge rate (based on current limited by resistor 395) during the time segment #2 as shown in FIG. 4 reduces QRR losses. Slow ramping of the voltage Vg in time segment #2 limits the amount of current that is able to pass from the drain node to the source node of control switch 150.

Eventually, during time segment #2, the voltage Vg ramps to threshold voltage Vth2 at or around time T3. At time T3, the increase of the voltage Vg to the threshold voltage Vth2 results in activation of switch Q3. Switch Q2 is in an OFF state in time segment #3. As shown, during time segment #3, switch Q3 is activated to quickly charge (at a rate substantially greater than the rate of charging the gate node 398 through resistor 395) the voltage, Vg, to a value substantially greater than the threshold voltage Vth2.

Subsequent to activating the control switch 150 for the duration of time segment #3, the controller 140 deactivates switch Q1 to an OFF state and activates switch Q5 to an ON state. This causes the control switch 150 to turn OFF. On a subsequent cycle of activating the control switch 150 again (such as via activation of switch Q1 to an ON state and deactivation of switch Q5 to an OFF state), the voltage ramping circuit 240 operates again in a similar manner as shown in timing diagram 400.

Note that, in one embodiment, the resistor 395 continuously provides a charge path to charge the gate node 398 between times T1 and time T4. However, as previously discussed, activation of switch Q2 during time segment #1 and activation of switch Q3 during time segment #3 substantially increases a rate of charging in comparison to the slow charge rate during time segment #2.

In accordance with further embodiments, and as further discussed herein, activation of the first circuit path during time segment #1 reduces a dead time between deactivating the synchronous switch 160 and subsequently activating the control switch 150. Activation of the second circuit path during time segment #2 reduces QRR (reverse recovery charge) losses in the switching power supply. Activation of the third circuit path during the time segment #3 reduces switching losses in the power supply.

Figure 5:
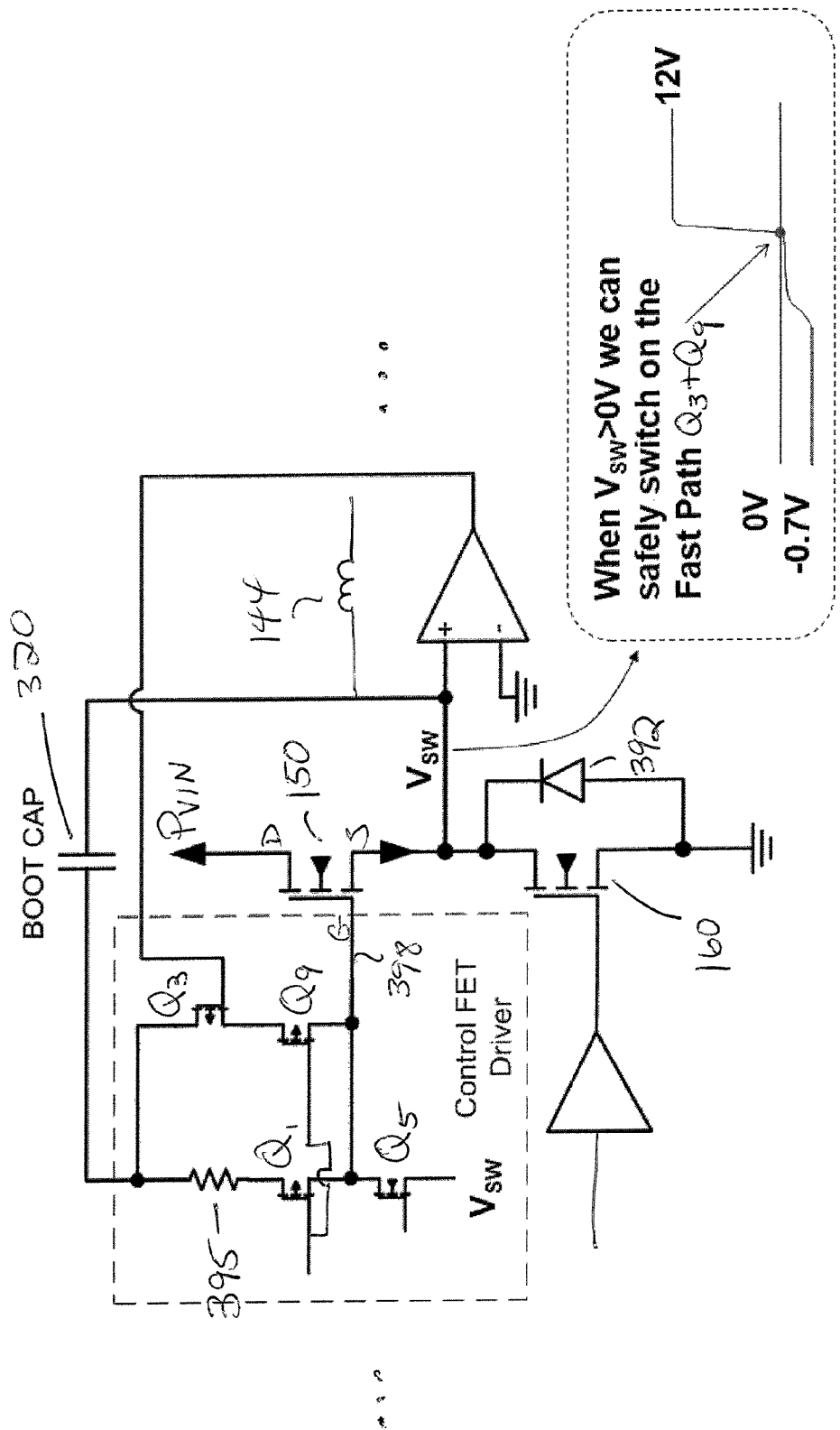
FIG. 5 is an example diagram illustrating monitoring of a power supply node (node SW) to control a rate of charging a gate node of a control switch according to embodiments herein.

FIG. 5 is an example diagram illustrating monitoring of a power supply node (node SW) to control a rate of charging a gate node of a control switch according to embodiments herein.

As an alternative to use of zener diode 390 and connecting of gate node of switch Q3 to Vcc as shown in FIG. 3, FIG. 5 illustrates use of comparator 450 to control fast charging of the gate node 398 during the time segment #3.

In accordance with this example embodiment, switch Q9 is activated at the same time that switch Q1 is activated. Comparator 450 monitors the voltage at node 325. When the voltage at node 325 is less than ground, the comparator 450 produces an output signal to deactivate switch Q3 to an OFF state. Conversely, when the comparator 450 detects that the voltage at node 325 is greater than the ground reference (or other suitable voltage reference), the comparator 450 initiates activation of switch Q3 to an ON state. When both switch Q3 and switch Q9 are activated to an ON state, this provides a fast charging path 610 to charge the gate node 398 during time segment #3.

Figure 6:
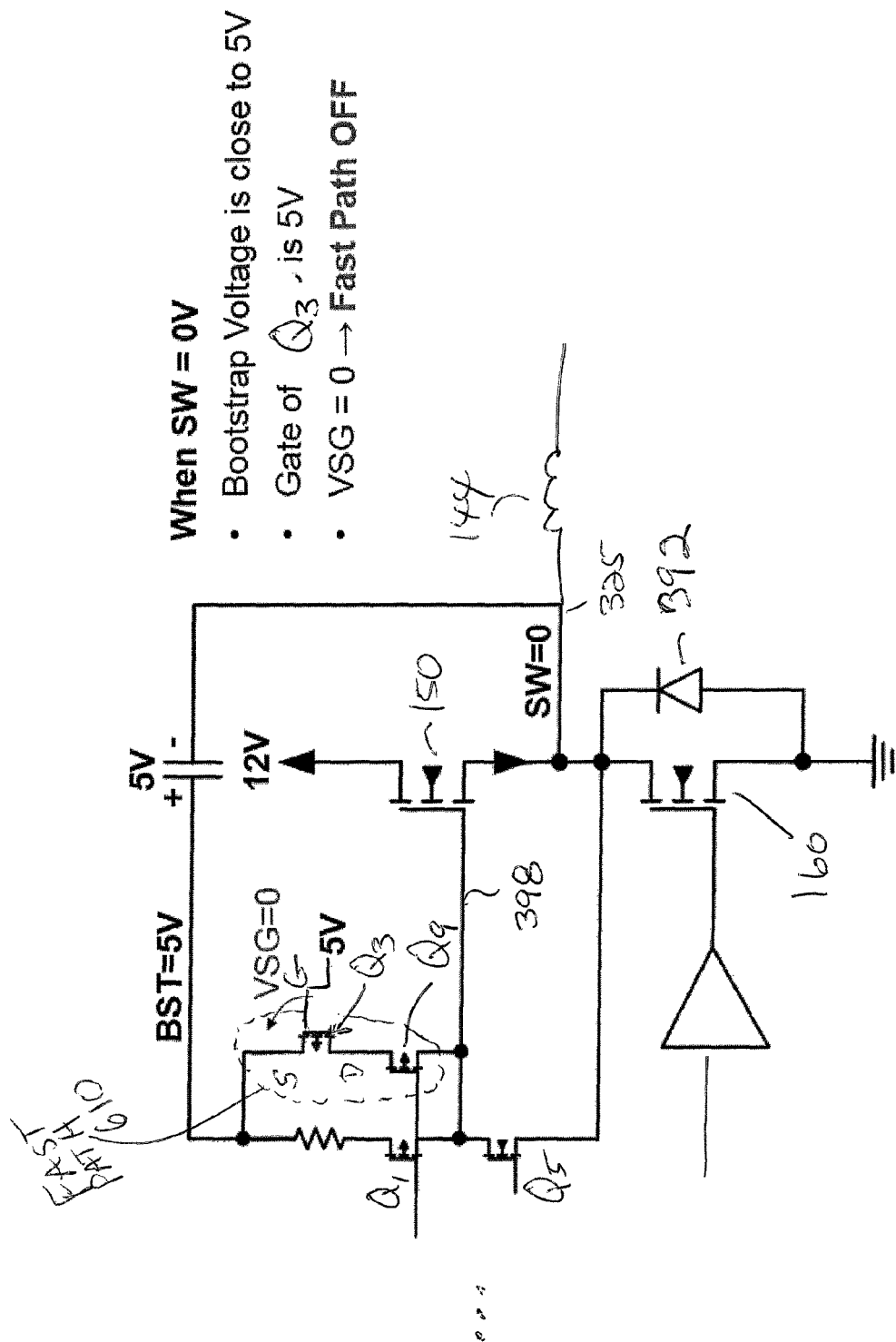
FIGS. 6-8 are example diagrams illustrating control of a fast charge path based on a magnitude of a power supply node according to embodiments herein.
Figure 7:
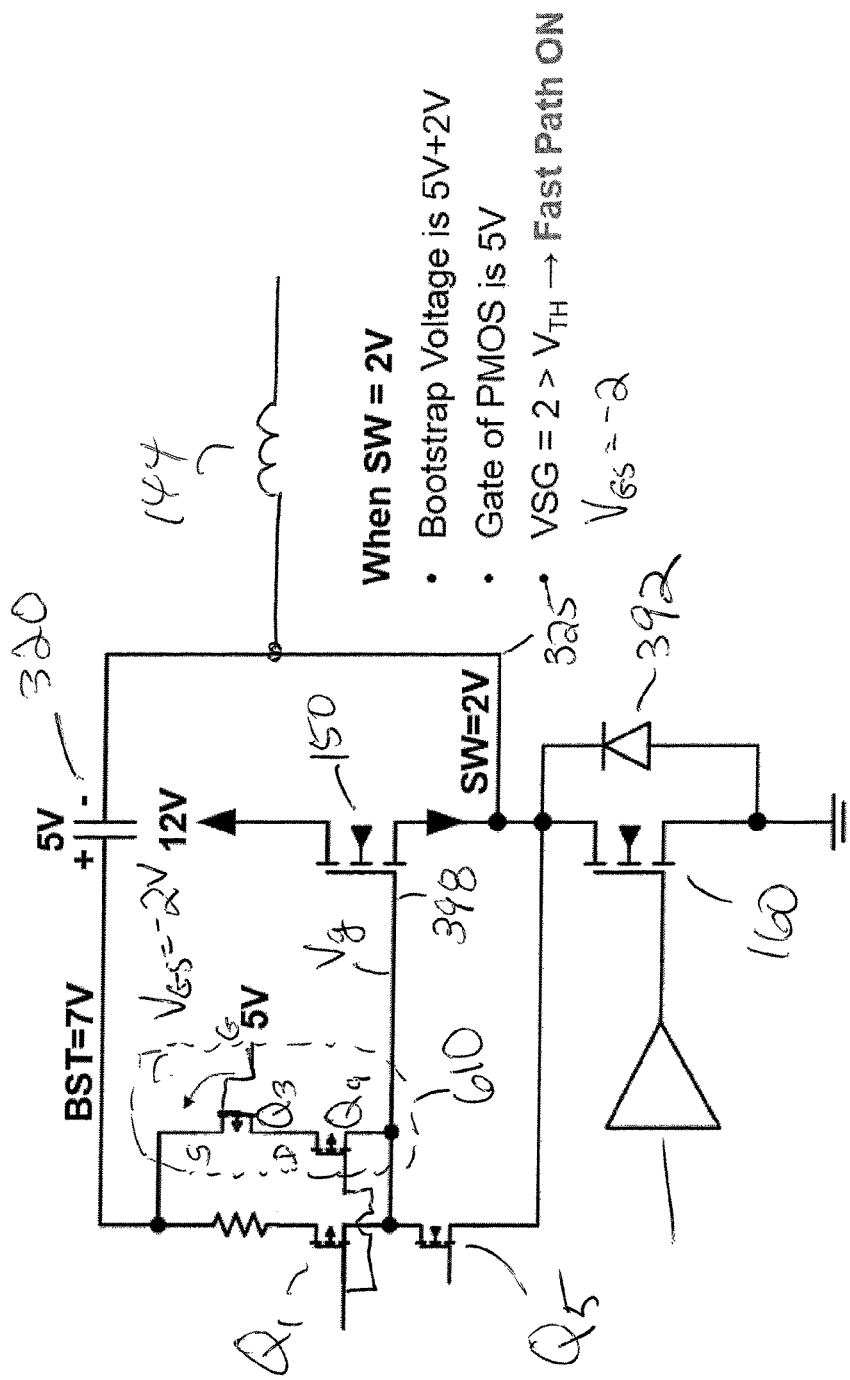
Figure 8:
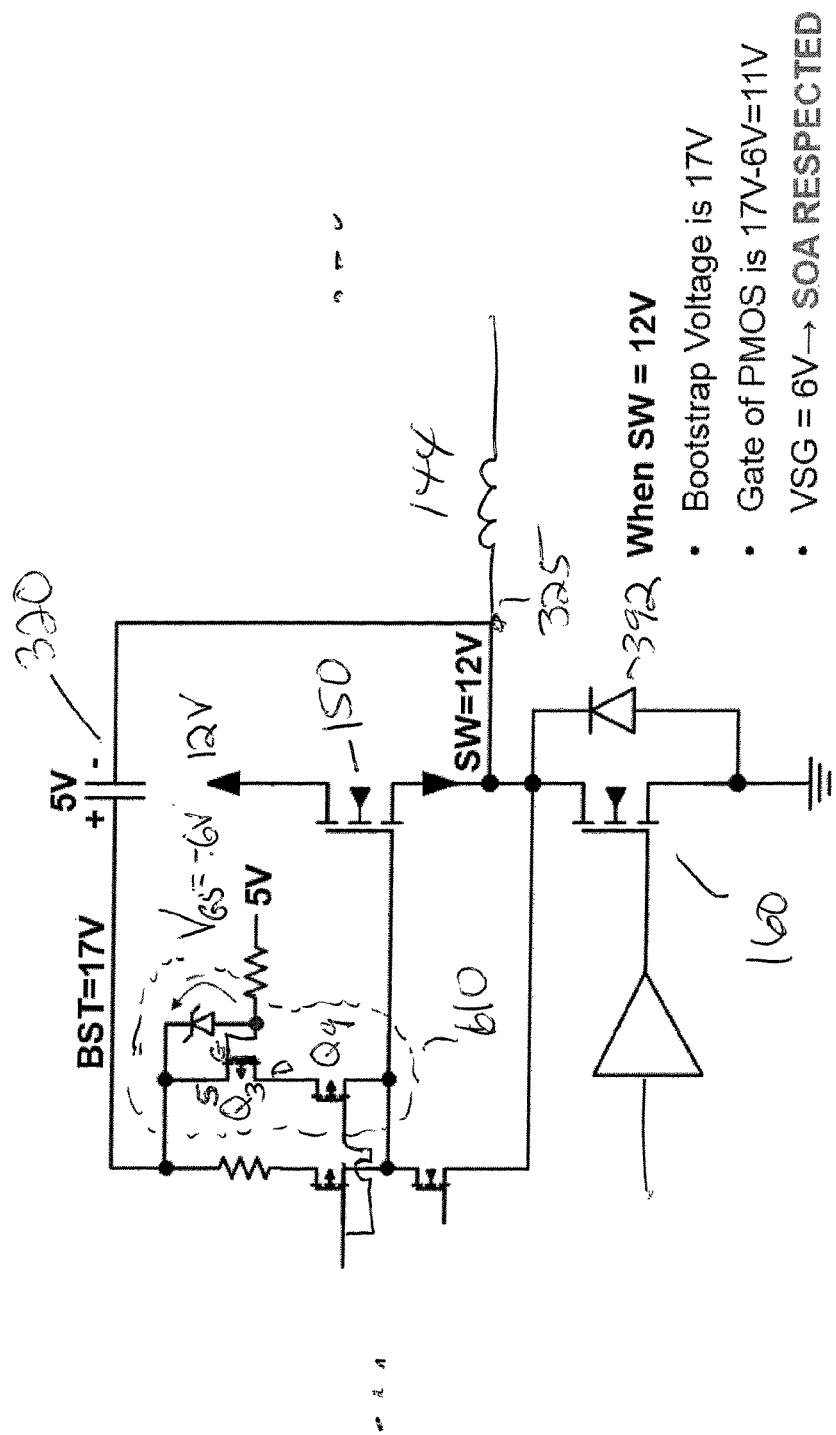

FIGS. 6-8 are example diagrams illustrating control of a fast charge path based on a magnitude of a power supply node according to embodiments herein.

As shown in FIG. 6, switch Q1 is turned to an ON state at time T1 in a manner as previously discussed. At such time T1, activation of the switch Q1 causes current flow through resistor 395 to charge the gate node 398 of the control switch 150. The voltage between the gate node of switch Q3 (set to Vcc of 5V) is equal to the source node voltage of switch Q3 (5V from capacitor 320). Thus, switch Q3 is initially in an OFF state at the time of activating the switch Q1.

As shown in FIG. 7, eventually, the control switch 150 is activated via the slow charging path including a series combination of resistor 395 and switch Q1. Assume that the magnitude of voltage SW voltage at the common node 325 increases to a voltage such as 2V (2 volts). The increase in voltage of the common node 325 and the voltage across the capacitor 320 causes the voltage of the source node of switch Q3 to be +7V. Because the gate node of switch Q3 is 5V, the voltage between the gate and source of switch Q3 is −2V, resulting in turning ON switch Q3 because it is a PMOS device. As previously discussed, activation of switch Q3 to the ON state, causes the fast path 610 (a combination of switch Q3 in an ON state and switch Q9 in an ON state) causes the voltage Vg to quickly increase towards 12V (resulting in activation of control switch 150 to the ON state).

As shown in FIG. 8, eventually, the voltage of the common node 325 increases to 12V as a result of activating the control switch 150. In such an instance, the voltage of the source node of switch Q3 attempts to raise to 17V. However, presence of the zener diode 390 clamps the voltage to 6V, protecting the switch Q3 from damage.

Figure 9:
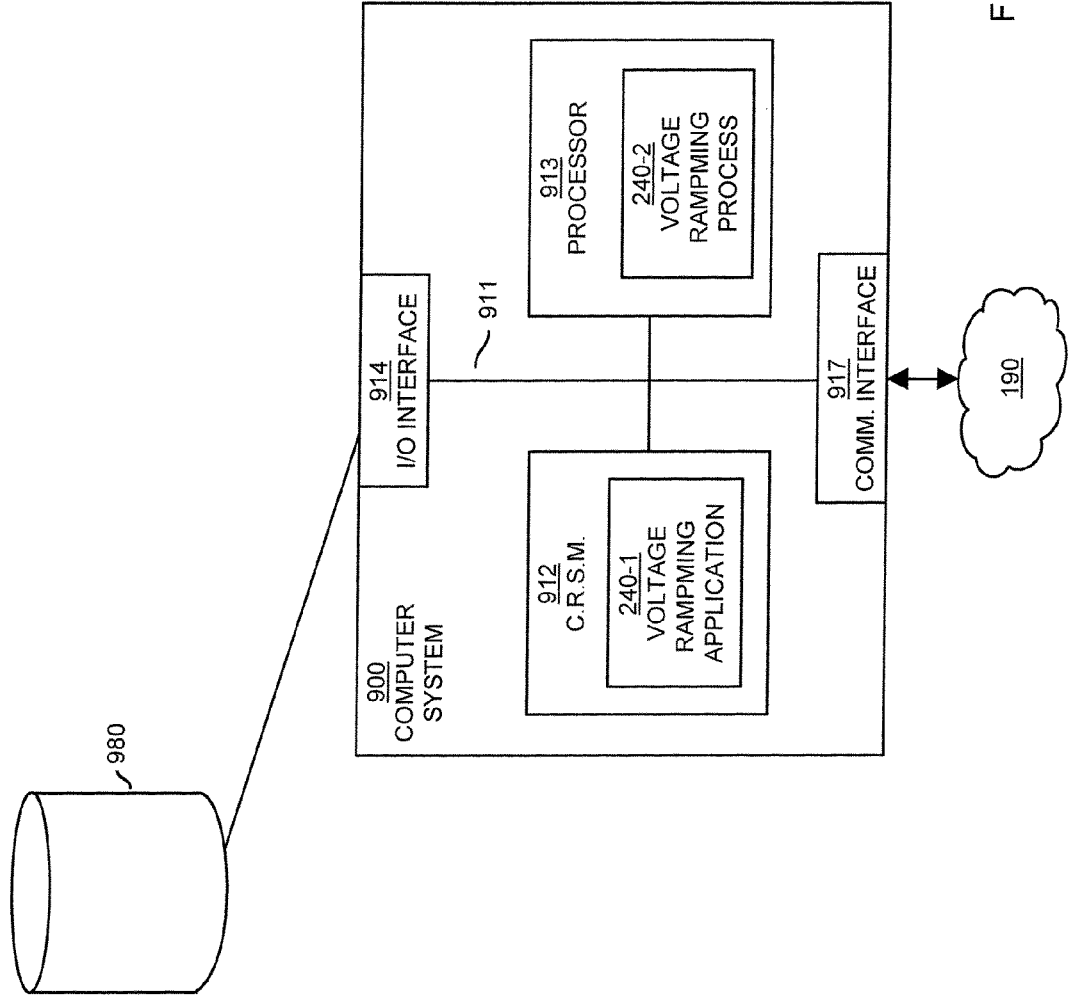
FIG. 9 is an example diagram illustrating a computer architecture to execute voltage ramping according to embodiments herein.

FIG. 9 is an example block diagram of a computer system for implementing any of the operations associated with voltage ramping according to embodiments herein. In one embodiment, the voltage ramping circuit 240 includes computer system 900 to facilitate ramping of the voltage, Vg.

As shown, computer system 900 of the present example includes an interconnect 911 that couples computer readable storage media 912 such as a non-transitory type of media (i.e., any type of hardware storage medium) in which digital information can be stored and retrieved, a processor 913 (e.g., a digital signal processor), I/O interface 914, and a communications interface 917.

I/O interface 914 provides connectivity to resources such as controller 140, storage resource 980, etc.

Computer readable storage medium 912 can be any hardware storage device such as memory, optical storage, hard drive, floppy disk, etc. In one embodiment, the computer readable storage medium 912 stores instructions and/or data.

Communications interface 917 enables the computer system 900 and processor 913 to communicate with other resources in power supply 100. I/O interface 914 enables processor 913 to receive and forward information.

As shown, computer readable storage media 912 is encoded with voltage ramping application 240-1 (e.g., software, firmware, etc.) executed by processor 913. Voltage ramping application 240-1 can be configured to include instructions to implement any of the operations as discussed herein.

During operation of one embodiment, processor 913 accesses computer readable storage media 912 via the use of interconnect 911 in order to launch, run, execute, interpret or otherwise perform the instructions associated with voltage ramping application 240-1 stored on computer readable storage medium 912.

Execution of the voltage ramping application 240-1 produces processing functionality such as voltage ramping process 240-2 in processor 913. In other words, the voltage ramping process 240-2 associated with processor 913 represents one or more aspects of executing voltage ramping application 240-1 within or upon the processor 913 in the computer system 700.

As previously discussed, the voltage ramping application 204-1 can be configured to support multistage ramping of voltage Vg to activate the control switch 150.

FIG. 10 is a flowchart 1000 illustrating an example method according to embodiments. Note that there will be some overlap with respect to concepts as discussed above.

In processing block 1010, the voltage ramping circuit 240 receives a switch control signal (e.g., input from controller 140) indicating to activate control switch Q1 to an ON state. A common node 325 in the power supply 100 connects the control switch 150 and a synchronous switch 160 in a series manner between a first reference voltage (PVIN) and a second reference voltage (ground). The common node 325 is coupled to inductor 144 that supplies current to load 118 depending on control settings of the control switch 150 and the synchronous switch 160.

In processing block 1020, the voltage ramping circuit 240 receives a feedback voltage over a circuit path (including capacitor 320) from the common node 325.

In processing block 1030, the voltage ramping circuit 240 implements a multistage ramping of a magnitude of the switch control voltage Vg. The multistage ramping of the magnitude of the switch control voltage Vg transitions the control switch 150 from an OFF state to an ON state. The multistage ramping of the magnitude of the switch control voltage, Vg, includes activation of one or more charge paths.

In sub processing block 1040, during a first time segment of ramping the magnitude of the switch control voltage, the voltage ramping circuit 240 pre-charges gate node 398 of the control switch 150 to a predetermined threshold voltage Vth1 (any suitable value).

In sub processing block 1050, during a second time segment of ramping the magnitude of the switch control voltage Vg, the voltage ramping circuit 240 charges the gate node 398 of the control switch 150 in accordance with a first charging rate. In other words, the resistor 395 limits the amount of current passing through switch Q1 to charge the gate node 398.

In sub processing block 1060, the voltage ramping circuit 240 transitions from the second time segment to a third time segment in response to a condition in which a magnitude of voltage at the common node 325 crosses a threshold value Vth2. In one embodiment, the threshold value Vth2 is substantially equal to the second reference voltage (such as ground) to which a source node of the synchronous switch 160 is connected. However, the second threshold value Vth2 can be any suitable value.

In sub processing block 1070, during the third time segment of ramping the magnitude of the switch control voltage Vg, the voltage ramping circuit 240 charges the gate node 398 of the control switch 150 in accordance with a second charging rate greater than a charging rate provided by current passing through resistor 395 and switch Q1 to the gate node 398 in time segment #2.

Note again that techniques herein are well suited for use in power supply applications and reducing losses in DC-to-DC voltage power converters, switching power supplies, synchronous buck converters, etc. However, it should be noted that embodiments herein are not limited to use in such applications and that the techniques discussed herein are well suited for use in other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred and summary embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

I claim:

1. A switching power supply circuit comprising:
    a control switch;
    a synchronous switch;
    a common node connecting the control switch and the synchronous switch in series between a first reference voltage and a second reference voltage, the common node coupled to an inductor that supplies current to a load; and
    a voltage ramping circuit coupled to the control switch, the voltage ramping circuit controlling ramping of a magnitude of a switch control voltage applied to control the control switch based on a magnitude of a feedback voltage received on a circuit path from the common node;
    wherein the voltage ramping circuit includes multiple switch charge paths independently activated to ramp the magnitude of the switch control voltage using the feedback voltage; and
    wherein the multiple switch charge paths includes a first switch charge path and a second switch charge path between the feedback voltage and a driver switch of the voltage ramping circuit, the driver switch operable to drive the switch control voltage to the control switch, the voltage ramping circuit controlling activation of the first switch charge path and activation of the second switch charge path during non-overlapping time segments to increase the magnitude of the switch control voltage to transition the control switch from an OFF state to an ON state.

2. The switching power supply circuit as in claim 1, wherein the voltage ramping circuit receives an input control signal, the input control signal indicating whether to activate the control switch; and
    wherein the voltage ramping circuit produces the switch control voltage based on a combination of the state of the input control signal and the magnitude of the feedback voltage received on the circuit path from the common node.

3. The switching power supply circuit as in claim 1, wherein the feedback path includes a capacitor conveying the feedback voltage from the common node to a charge control switch device in the voltage ramping circuit, the feedback voltage activating the charge control switch device to an ON state, a series combination of the capacitor and activated charge control switch device and the driver switch conveying the feedback voltage to a gate node of the control switch.

4. The switching power supply circuit as in claim 1, wherein the voltage ramping circuit includes a charge control switch device that is activated when the magnitude of the feedback voltage is above a threshold value, activation of the charge control switch device increasing a rate of ramping a magnitude of the switch control voltage during which the control switch is transitioned from the OFF state to the ON state.

5. The switching power supply circuit as in claim 1, wherein the first switch charge path includes a charge control switch device that is activated in response to a condition in which a voltage magnitude of the common node increases above a threshold value.

6. The switching power supply circuit as in claim 5, wherein the first switch charge path includes a series circuit including a capacitor and the charge control switch device, activation of the charge control switch device conveying the switch control voltage from the capacitor through the charge control switch device and the driver switch to the control switch.

7. The switching power supply circuit as in claim 1, wherein the voltage ramping circuit controls activation of the multiple switch charge paths during different time segments to convey charge from the received feedback voltage to increase the magnitude of the switch control voltage.

8. The switching power supply circuit as in claim 1, wherein the voltage ramping circuit controls a rate of increasing the magnitude of the switch control voltage via activation of the multiple switch charge paths conveying charge from the received feedback voltage.

9. A switching power supply circuit comprising:
   a control switch;
   a synchronous switch;
   a common node connecting the control switch and the synchronous switch in series between a first reference voltage and a second reference voltage, the common node coupled to an inductor that supplies current to a load;
   a voltage ramping circuit coupled to the control switch, the voltage ramping circuit controlling ramping of a magnitude of a switch control voltage applied to control the control switch based on a magnitude of a feedback voltage received on a circuit path from the common node;
   wherein the voltage ramping circuit implements a multistage ramping of a magnitude of the switch control voltage, the multistage ramping of the magnitude of the switch control voltage transitioning the control switch from an OFF state to an ON state, the multistage ramping of the magnitude of the switch control voltage including activation of a charge path based on the magnitude of the feedback voltage;
   wherein the voltage ramping circuit:
      during a first time segment of ramping the magnitude of the switch control voltage from the OFF state to the ON state, pre-charges a gate node of the control switch to a predetermined threshold voltage;
      during a second time segment of ramping the magnitude of the switch control voltage from the OFF state to the ON state, charges the gate node of the control switch in accordance with a first charging rate; and
      during a third time segment of ramping the magnitude of the switch control voltage from the OFF state to the ON state, charges the gate node of the control switch in accordance with a second charging rate, the second charging rate greater than the first charging rate.

10. The switching power supply circuit as in claim 9, wherein the voltage ramping circuit transitions from the second time segment to the third time segment in response to a condition in which a magnitude of voltage at the common node crosses a threshold value.

11. The switching power supply circuit as in claim 10, wherein the threshold value is the second reference voltage to which a source node of the synchronous switch is connected.

12. The switching power supply circuit as in claim 10, wherein occurrence of the condition activates a charge control switch device disposed between the circuit path and the gate node of the control switch to charge the gate node of the control switch.

13. The switching power supply circuit as in claim 12, wherein the circuit path includes a capacitor that conveys an AC voltage of the common node to the charge control switch device.

14. A switching power supply circuit comprising:
   a control switch;
   a synchronous switch;
   a common node connecting the control switch and the synchronous switch in series between a first reference voltage and a second reference voltage, the common node coupled to an inductor that supplies current to a load; and
   a voltage ramping circuit coupled to the control switch, the voltage ramping circuit controlling ramping of a magnitude of a switch control voltage applied to control the control switch based on a magnitude of a feedback voltage received on a circuit path from the common node;
   wherein the voltage ramping circuit includes a first charge control path, a second charge control path, and a third charge control path to produce the switch control voltage, each of the first charge control path, the second charge control path, and the third charge control path activated during different time segments to ramp a magnitude of the switch control voltage, transitioning the control switch from an OFF state to an ON state.

15. The switching control circuit as in claim 14, wherein activation of the first control path, the second control path, and the third control path during different times segments of multistage ramping of the switch control voltage reduces a magnitude of a parameter selected from the group consisting of:
   i) a QRR of the switching power supply circuit,
   ii) switching losses in the switching power supply circuit, and
   iii) a dead time between deactivation of the synchronous switch and activation of the control switch.

16. A switching power supply circuit comprising:
   a control switch;
   a synchronous switch;
   a common node connecting the control switch and the synchronous switch in series between a first reference voltage and a second reference voltage, the common node coupled to an inductor that supplies current to a load; and
   a voltage ramping circuit coupled to the control switch, the voltage ramping circuit including a first charge path, a second charge path, and a third charge path:
      the first charge path pre-charging a gate node of the control switch to a predetermined threshold voltage during a first time segment;
      the second charge path ramping a voltage magnitude of the gate node in accordance with a first charging rate during a second time segment; and
      the third charge path ramping the voltage magnitude of the gate node in accordance with a second charging rate, the second charging rate greater than the first charging rate.

17. The switching power supply circuit as in claim 16, wherein the first charge path, the second charge path, and the third charge path are disposed in parallel in a parallel circuit.

18. The switching power supply circuit as in claim 17, wherein the parallel circuit is disposed in series with a capacitor coupled to the common node, the capacitor conveying an AC voltage of the switch node to a gate node of the control switch.

19. The switching power supply circuit as in claim 18, wherein the third charge path includes a switch device that activates to an ON state when the magnitude of input voltage of the switch node exceeds a threshold voltage, activation of the switch device to the ON state electrically connecting the capacitor to the gate node.

20. A method comprising:
receiving a switch control signal indicating to activate a control switch in a power supply, a common node in the power supply connecting the control switch and a synchronous switch in a series manner between a first reference voltage and a second reference voltage, the common node coupled to an inductor that supplies current to a load;
receiving a feedback voltage over a circuit path from the common node; and
based on a magnitude of the feedback voltage, activating a charge path to produce a switch control voltage that controls activation of the control switch;
implementing a multistage ramping of a magnitude of the switch control voltage, the multistage ramping of the magnitude of the switch control voltage transitioning the control switch from an OFF state to an ON state, the multistage ramping of the magnitude of the switch control voltage including activation of the charge path;
wherein implementing the multistage ramping of the magnitude of the switch control voltage comprises: during a first time segment of ramping the magnitude of the switch control voltage from the OFF state to the ON state, pre-charging a gate node of the control switch to a predetermined threshold voltage; during a second time segment of the ON state, charging the gate node of the control switch in accordance with a first charging rate; and during a third time segment of ramping the magnitude of the switch control voltage from the OFF state to the ON state, charging the gate node of the control switch in accordance with a second charging rate, the second charging rate greater than the first charging rate.

21. The method as in claim 20, wherein activating the charge path based on the magnitude of the feedback voltage includes activation of a charge control switch device that electrically couples the feedback voltage received over the circuit path to a gate node of the control switch, the feedback voltage charging the gate node of the control switch, the charge control switch device activated based on the magnitude of the feedback voltage crossing a threshold.

22. The method as in claim 21, wherein the circuit path includes a capacitor coupled to the common node, the method further comprising:
receiving the feedback voltage through the capacitor coupled to the common node.

23. The method as in claim 20 further comprising:
transitioning from the second time segment to the third time segment in response to a condition in which a magnitude of voltage at the common node crosses a threshold value.

* * * * *